US008159270B2

(12) United States Patent
Hollis

(10) Patent No.: US 8,159,270 B2
(45) Date of Patent: Apr. 17, 2012

(54) CIRCUITRY AND METHODS MINIMIZING OUTPUT SWITCHING NOISE THROUGH SPLIT-LEVEL SIGNALING AND BUS DIVISION ENABLED BY A THIRD POWER SUPPLY

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 12/259,625

(22) Filed: Oct. 28, 2008

(65) Prior Publication Data

US 2010/0102853 A1   Apr. 29, 2010

(51) Int. Cl.
*H03K 19/082* (2006.01)
(52) U.S. Cl. ............................ 326/86; 326/115
(58) Field of Classification Search ............ 326/82–83, 326/86, 112, 115; 327/108, 109
See application file for complete search history.

(56) References Cited

U.S. PATENT DOCUMENTS

| 5,145,799 | A | 9/1992 | Rodder |
| 5,576,639 | A | 11/1996 | Park |
| 6,586,974 | B1 * | 7/2003 | Humphrey et al. ............ 327/108 |
| 6,617,925 | B2 * | 9/2003 | Hoang ........................... 330/258 |
| 6,768,352 | B1 * | 7/2004 | Maher et al. ................... 327/112 |
| 6,836,148 | B2 | 12/2004 | Pullen et al. |
| 6,879,190 | B2 | 4/2005 | Kim et al. |
| 7,027,276 | B2 | 4/2006 | Chen |
| 7,196,551 | B2 * | 3/2007 | Lee ................................. 326/115 |
| 7,245,156 | B2 * | 7/2007 | Yeung et al. .................... 326/86 |
| 7,595,661 | B2 * | 9/2009 | Kim ................................ 326/82 |

FOREIGN PATENT DOCUMENTS

KR   10-2001-0005093   1/2001

OTHER PUBLICATIONS

U.S. Appl. No. 12/208,562, filed Sep. 11, 2008, B. Cook.
U.S. Appl. No. 12/106,552, filed Apr. 21, 2008, T. Hollis.
U.S. Appl. No. 12/106,552, filed Apr. 21, 2008, Hollis.
U.S. Appl. No. 12/101,770, filed Apr. 11, 2008, Lee.
J. Poulton, "A 14-mW 6.25-Gb/s Transceiver in 90-nm CMOS," IEEE J. Solid State Circuits, vol. 42, No. 12, p. 2745-2757 (Dec. 2007).
JEDEC Standard JESD8-13, Scalable Low-Voltage Signaling for 400 mV (SLVS-400) (Oct. 2001).
Mobile Industry Processor Interface (MIPI): "MIPI Alliance Specification for D-PHY," ver. 0.90.00 (Oct. 8, 2007).

* cited by examiner

*Primary Examiner* — James H Cho
(74) *Attorney, Agent, or Firm* — Wong Cabello Lutsch, Rutherford & Brucculeri, LLP

(57) ABSTRACT

Disclosed herein are circuitry and methods for transmitting data across a parallel bus using both high common mode and low common mode signaling. The transmitter stages are configured to work with two of three possible power supply voltages: a high Vddq voltage, a low Vssq voltage, and an intermediate Vx voltage. In one embodiment, the odd numbered transmitter stages, that drive the odd numbered outputs to the bus, use the Vddq and Vx supplies, such that the odd numbered outputs comprise high common mode signals. The even numbered transmitter stages, that drive the even numbered outputs to the bus, use the Vx and Vssq supplies, such that the even numbered outputs comprise low common mode signals. With the transmitter and power supplies so configured, no one of the three power supplies must source or sink current to or from more than half of the transmitters at any given time, which reduces power supply loading and minimizes switching noise. As a result, use of the technique may dispense with the need to provide power supply isolation at the transmitters.

28 Claims, 13 Drawing Sheets

CIRCUITRY AND METHODS MINIMIZING OUTPUT SWITCHING NOISE THROUGH SPLIT-LEVEL SIGNALING AND BUS DIVISION ENABLED BY A THIRD POWER SUPPLY

FIELD OF THE INVENTION

Embodiments of the invention relate to circuitry particularly useful for minimizing output switching noise in an integrated circuit such as in a Synchronous Dynamic Random Access memory (SDRAM).

BACKGROUND

FIG. 1 illustrates a typical Synchronous Dynamic Random Access Memory (SDRAM) 10, which could include for example a Double Date Rate (DDRx) SDRAM. Specifically shown is a data bus 11, by which data enters and exits the chip. As is typical, this data bus 11 comprises several signals DQ1-DQn which operate in parallel. On the other end of the data bus 11 is another circuit 12, which could comprise a memory controller, a microprocessor, or any other circuit with which the SDRAM 10 might communicate. Typically, SDRAM 10 and circuit 12 comprise discrete integrated circuits mounted to a printed circuit board, such that data bus 11 comprises traces on that printed circuit board. However, this is not strictly necessary, and SDRAM 10 and circuit 12 could also comprise circuit blocks within a single integrated circuit.

Also evident in FIG. 1 are external power supply connections to the SDRAM 10. Specifically shown are two sets of power supply voltages: Vdd and Vss; and Vddq and Vssq. Each set is isolated from the other: Vdd is isolated within the SDRAM 10 from Vddq, and likewise for Vss and Vssq. As one skilled in the art will recognize, Vdd and Vddq typically comprise a positive voltage (perhaps 1.5V or so; Vdd and Vddq can however differ from one another), while Vss and Vssq comprise a lower potential, which is usually ground (i.e., 0V; again, they can differ). An actual SDRAM 10 would of course have other inputs and outputs as well (e.g., address and control signals), but these are not shown in FIG. 1.

Isolation of the power supply sets allows for each set to power different circuitry blocks within the SDRAM 10. Typically, the Vdd/Vss power supply set powers most of the normal logic circuitry in SDRAM 10, such as the array, decode/driver circuitry, and associated logic. By contrast, the Vddq/Vssq power supply set powers the output driver circuitry 20, at least in part, as shown in FIG. 2. Shown in FIG. 2 are the output paths for the various data output signals (DQ1-DQn), which signals typically terminate at bond pads 13 on the SDRAM 10 before proceeding to the data bus 11. (Further details concerning the circuitry of FIG. 2 can be found in U.S. patent application Ser. No. 12/208,562, filed Sep. 11, 2008, to which the reader is referred).

As can be seen, in each of these output paths, pull up (PU) and pull down (PD) drive signals are used to drive the bond pads 13 to a particular logic level. When the output paths are outputting signals to the pads 13, the PU and PD drive signals will (in the illustrated example) be the same in a given path. Therefore, to drive DQ(1) high for example, PU(1)=PD(1)=logic '1.' To drive DQ(1) low, PU(1)=PD(1)=logic '0.' The drive signals PU<1:n> and PD<1:n> could, however, be complementary in other configurations. In still other configurations, each output data path may need only one driving signal, with one state of that signal directing DQ(x) to go high, and the other state directing DQ(x) to go low.

(Even though the PU and PD drive signals are discussed herein as being tied to the same logic level, one skilled in the art will understand that it can still be useful to have these drive signals split so that each can be independently controlled during times when an output is not being driven to the pads 13. For example, independent assertion of PU and PD can be useful during times when the pad is receiving signals to set a proper termination resistance, an approach sometimes referred to as On-Die Termination. For further details, see Micron Technical Note DDR3 ZQ Calibration (2008) (http://download.micron.com/pdf/technotes/DDR3/TN4102.pdf), which is submitted in an Information Disclosure Statement filed with this application).

Because each of the output signals are transferred off of the SDRAM 10 where they will encounter higher capacitances presented by a printed circuit board for example, it is generally preferred to boost the power of the drive signals by ultimately boosting the power of the signals generated at the pads 13. Accordingly, each of the drive signals is progressively boosted along their output paths to higher power capacities by a series of stages. In FIG. 2, stages a-e comprise serially-connected CMOS inverters, and together these can be called buffer stages, B<1:n>. Stage f comprises serially-connected pull-up or pull-down transistors, and because this stage ultimately acts to output the signal to the pads 13, it can be called the transmitter stage, TX<1:n>. Other types of stages can be used as well. In each successive stage, larger (or wider) transistors are used to increase output current. Thus, stage b is larger than stage a, stage c is larger than stage b, etc.

Successive boosting of the power of the drive signals raises the risk of corrupting of the power supply voltages by noise. Accordingly, it is currently preferred, as shown in FIG. 2, to use two isolated power supply sets, such as the Vdd/Vss and Vddq/Vssq sets. These power supply sets may be unregulated by the SDRAM 10, such that they comprise the externally-asserted supplies discussed earlier with respect to FIG. 1. Or, they may comprise versions of these external supplies internally regulated by the SDRAM 10. In any event, the sets are shown in FIG. 2 and in subsequent figures using the same Vdd/Vss and Vddq/Vssq nomenclature for simplicity, which may comprise either regulated or unregulated supplies.

As shown, the first two stages a and b in the output driver circuitry 20 are powered by the Vdd/Vss power supply set. As mentioned earlier, such a power supply set may be used to power the array and logic circuitry in the SDRAM 10. The last stages c-f in the output driver circuitry 20 are powered from the Vddq/Vssq power supply set, which is usually dedicated to the output driving task. As such, the drive signals pass from one power supply domain (i.e., the Vdd/Vss domain) to another power supply domain (i.e., the Vddq/Vssq domain), which boundary occurs at the dotted line 15 between stages b and c in the example illustrated in FIG. 2.

Through this use of dual power supply sets, noise present on the Vddq/Vssq power supply set, as might result from the high-current switching of data at the later stages in the output paths, is prevented, to some degree, from being transferred to the Vdd/Vss power supply set feeding the remainder of the circuitry on the SDRAM 10. However, while the transition of the drive signals between these power supply domains helps to isolate noise between the domains, the decoupling of these two power supply domains has drawbacks. In particular, decoupling the Vddq/Vssq domain from the Vdd/Vss domain renders the Vddq/Vssq domain more susceptible to switching noise than it would be were the entire SDRAM 10 governed by a single, more-heavily-loaded, power domain. Thus, Vddq/Vssq is more easily perturbed as a result of such switching noise. Such noise can be heavily dependent on the particular logic levels being switched at the bond pads 13 at a given time. For example, the output of all logic '1's (or mostly logic '1's) on DQ<1:n> ('11111111'), creates a power-intensive situation which might load down and hence create noise on Vddq, while the output of all logic '0' (or mostly logic '0's) on DQ<1:n> ("0000000") might similarly create or increase noise on Vssq. Furthermore, the transitioning between all '1's and all '0's may be even more problematic in many cases.

Switching noise in the Vddq/Vssq domain creates problems for data integrity, and can interfere with the transmission and reception of data at the SDRAM 10. Moreover, the perceived necessity of using two power domains provides an imperfect solution, and one adding additional complexity. Improved output data path architectures are therefore desired, and this disclosure presents certain improvements.

DETAILED DESCRIPTION

Disclosed herein are circuitry and methods for transmitting data across a parallel bus using both high common mode and low common mode signaling. The transmitter stages are configured to work with two of three possible power supply voltages: a high Vddq voltage, a low Vssq voltage, and an intermediate Vx voltage. In one embodiment, the odd numbered transmitter stages, that drive the odd numbered outputs to the bus, use the Vddq and Vx supplies, such that the odd numbered outputs comprise high common mode signals. The even numbered transmitter stages, that drive the even numbered outputs to the bus, use the Vx and Vssq supplies, such that the even numbered outputs comprise low common mode signals. With the transmitter and power supplies so configured, no one of the three power supplies must source or sink current to or from more than half of the transmitters at any given time, which reduces power supply loading and minimizes switching noise. As a result, use of the technique may dispense with the need to provide power supply isolation at the transmitters.

Figure 3:
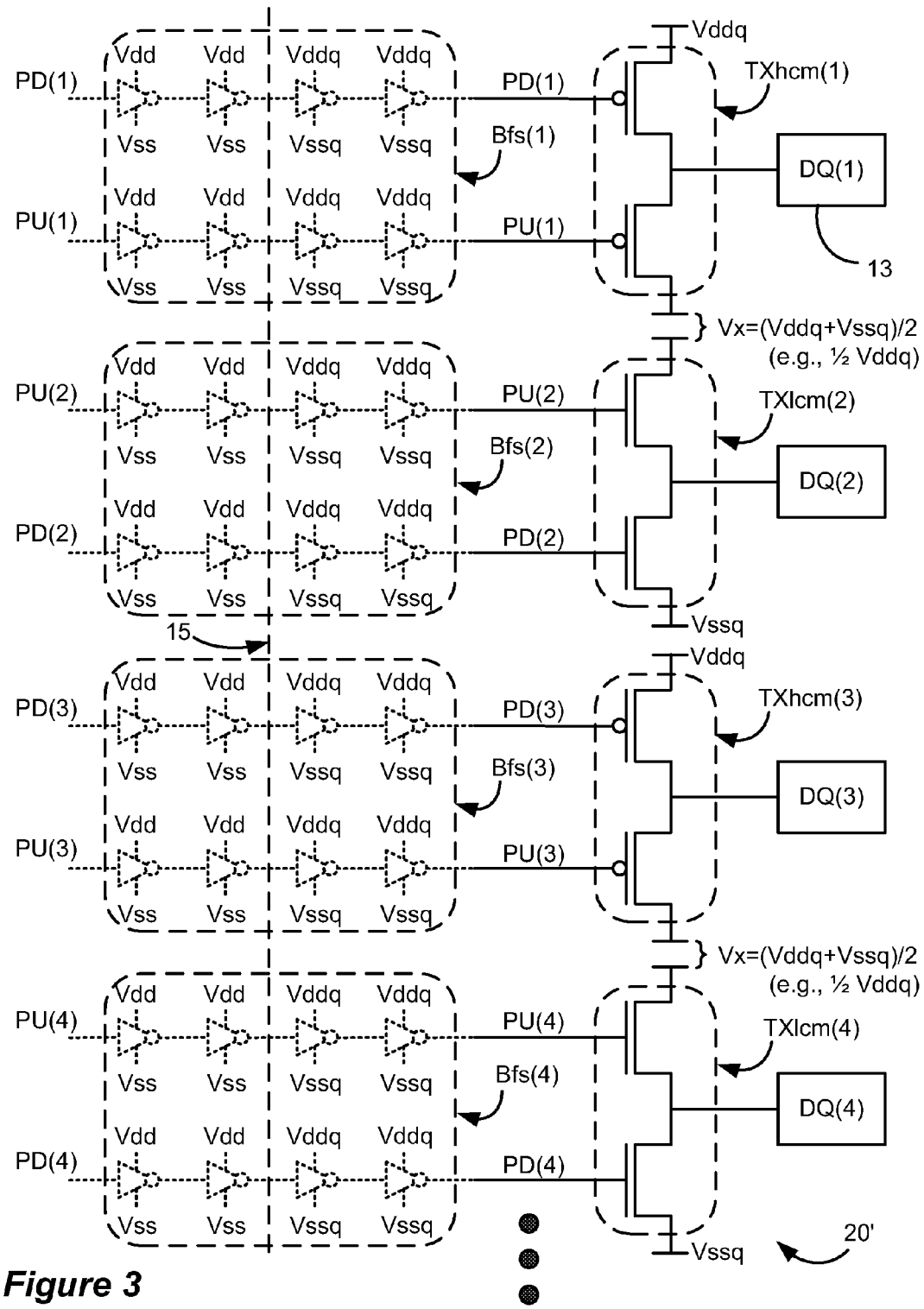
FIG. 3 illustrates improved output driver circuitry in accordance with one embodiment of the invention employing three power supply voltages and both low and high common mode signaling.

Improved output driver circuitry 20', employing three power supply voltages and both low and high common mode signaling, is shown first in FIG. 3. Four output data paths, i.e., those for outputs DQ(1), DQ(2), DQ(3), and DQ(4), are shown, but in an actual system there may be many more output signals which operate in parallel to form the bus 11, such as 8, 16, 32, etc. This disclosure generally discusses an 8-bit bus 11 (DQ<1:8>) for simplicity.

Figure 1:
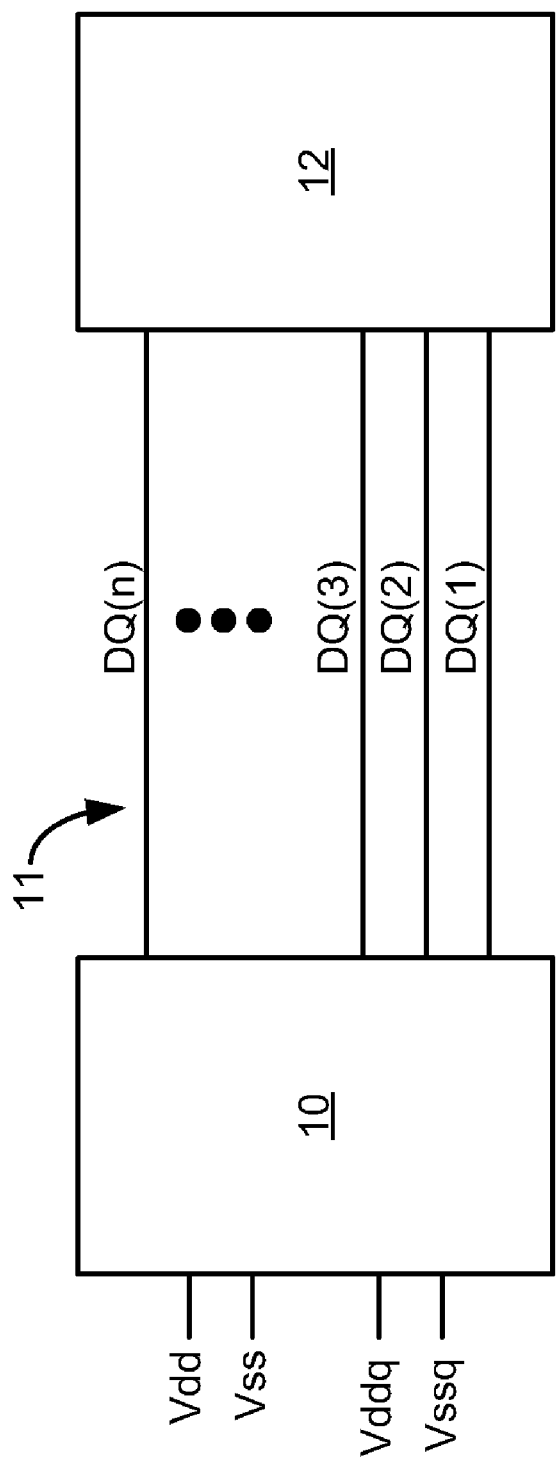
FIG. 1 illustrates a transmitting device such as an SDRAM and a receiving device with a parallel bus between them, in accordance with the prior art.
Figure 2:
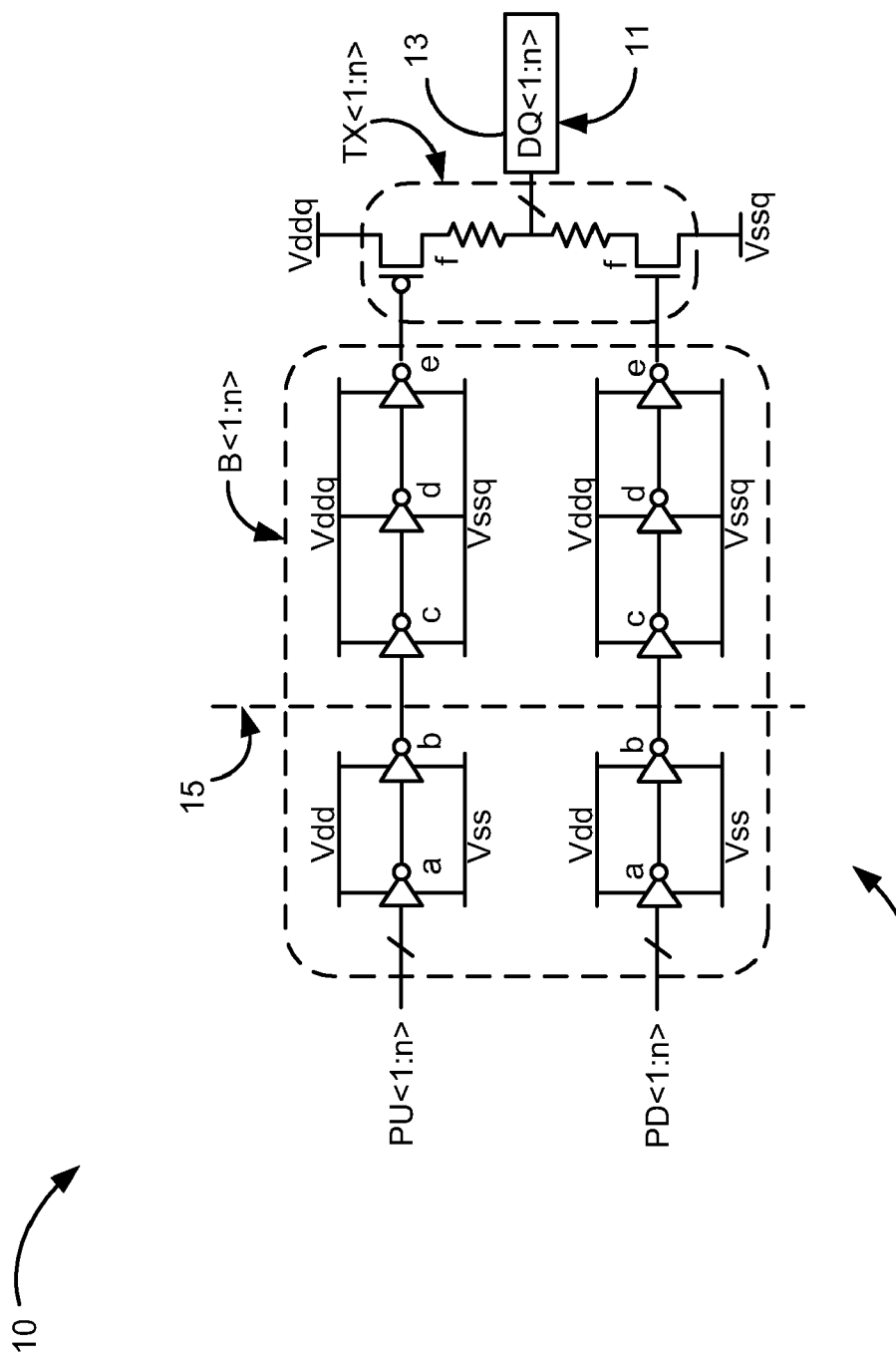
FIG. 2 illustrates an output driver circuitry of the prior art.

As before, each of the output data paths are divided into a buffer stage, B(x), and a transmitter stage TX(x), although different nomenclatures are used for these circuitry blocks for reasons to be explained later. Also, as before, each data path receives two drive signals, PU(x) and PD(x). As with the prior art, depicted in FIG. 2, each of these signals is preferably independently controllable, thus providing the benefits described in the Background section of this disclosure. However, unlike FIG. 2, the drive signals are complementary when driving a signal to the output pads 13. Thus, to drive output DQ(1) high, PU(1)=1 while PD(1)=0. Conversely, to drive output DQ(1) low, PU(1)=0 while PD(1)=1. Likewise, to drive output DQ(2) high, PU(2)=1 while PD(2)=0, while to drive it low PU(2)=0 and PD(2)=1, etc.

In accordance with one embodiment of the invention, the circuitry for a given output data path differs depending on whether it is associated with an odd data output (DQ(1), DQ(3), DQ(5), and DQ(7)) or an even data output (DQ(2), DQ(4), DQ(6), and DQ(8)). In particular, in the embodiment shown, differences are present in the transmitter stages, TX(x). Worthy of particular note are the use of three different power supply voltages, Vddq, Vssq, and Vx. Vddq and Vssq are essentially similar to that described in the prior art. Power supply Vx is however a new contribution. Any or all of these three power supply voltages Vddq, Vssq, and Vx can be externally applied to the SDRAM 10, or internally generated using voltages regulators within the SDRAM 10, for example.

The power supply voltages used are different for the odd and even transmitter stages. The high supply for the odd transmitter stages comprises Vddq, while the low supply for the odd transmitter stages comprises Vx, an intermediate power supply voltage between Vddq and Vssq. By contrast, the high supply for the even transmitter stages comprises the intermediate power supply voltage Vx, while the low supply for the even transmitter stages comprises Vssq. If one assumes in a given application that Vssq=0V, and that Vx is exactly midway between Vddq and Vssq, then Vx=½Vddq.

Figure 4:
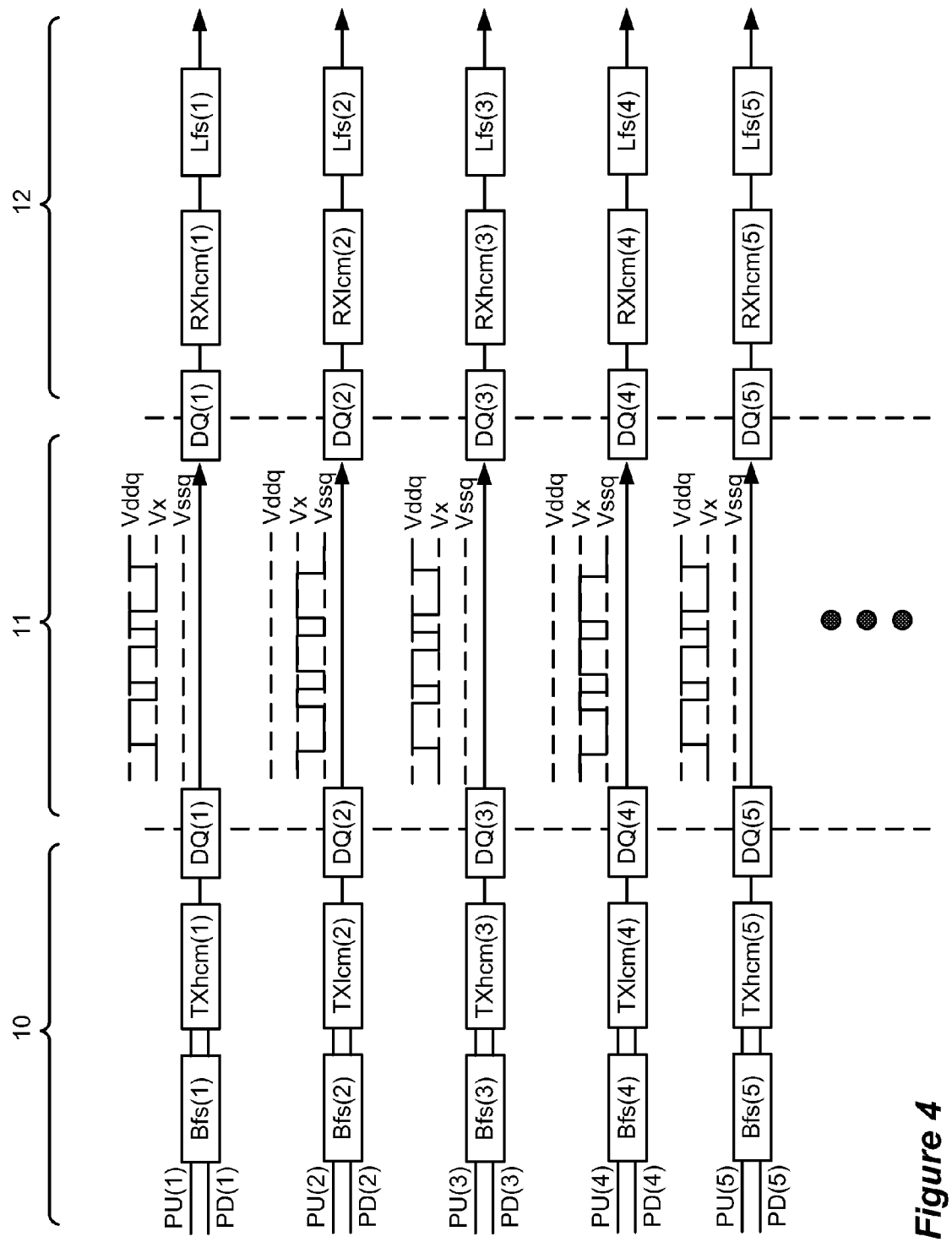
FIG. 4 illustrates the improved output driver circuitry in the larger system context of a bus and a receiving device.

These power supplies for the transmitter stages constrain the voltages driven to the outputs, such that the odd data outputs DQ(1), DQ(3), DQ(5) and DQ(7) range between Vddq and Vx, and the even data outputs DQ(2), DQ(4), DQ(6) and DQ(8) range between Vx and Vssq, as best shown in FIG. 4. Because the voltage range for the odd outputs is smaller than the full swing range in the otherwise standard Vddq/Vssq domain, and because such signals occur in an upper voltage portion of that domain, the odd data outputs comprise "high common mode" signals. Accordingly, the transmitter stages for the odd outputs are labeled as 'TXhcm (o),' where 'hcm' designates high common mode and 'o' designates an odd number. By contrast, because the voltage range for the even outputs is smaller than the full swing range in the otherwise standard Vddq/Vssq domain, and because such signals occur in a lower voltage portion of that domain, the even data outputs comprise "low common mode" signals. Accordingly, the transmitter stages for the even outputs are labeled as 'TXlcm(e),' where 'lcm' designates low common mode and 'e' designates an even number.

Referring again to FIG. 3, the depicted transmitter stages comprise transistors of the same polarity. Specifically, the odd transmitter stages TXhcm(o) comprise two serially-connected P-channel transistors, while the even transmitter stages TXlcm(e) comprise two serially-connected N-channel transistors. This is different from the prior art depicted in FIG. 2, in which the transmitters TX<1:n> were comprised of two serially-connected transistors of differing polarities. However, in other designs, it would not be strictly necessary to use transistors of the same polarity in the transmitter stages. Notice that the pull up (PU(o)) and pull down (PD(o)) drive signals in the odd buffer stages are reversed in position when compared with their counterparts in the even buffer stages. This reflects the polarity difference between the P-channel transistors in the odd transmitter stages TXhcm(o), which are turned on by low signals, and N-channel transistors in the even transmitter stages TXlcm(e), which are turned on by high signals. Of course, this nomenclature is arbitrary and could be changed in the schematics of an actual implementation.

Because the transistors in the transmitter stages TXhcm(o) and TXlcm(e) of FIG. 4 are of the same polarity, it is beneficial that the drive signals PU(x) and PD(x) be complementary, as discussed earlier, so that only one of the transistors is driven at any one time. For example, assertion of PU(o)=1 and PD(o)=0 in the odd data paths will turn on the top P-channel transistors in transmitter stages TXhcm(o), which sets DQ(o) to Vddq, the high logic state for the high common mode signals. Conversely, assertion of PU(o)=0 and PD(o)=1 in the odd data paths will turn on the bottom P-channel transistors, which sets DQ(o) to Vx, the low logic state of the high common mode signals. Turning to the even data paths, assertion of PU(e)=1 and PD(e)=0 in the even data paths will turn on the top N-channel transistors in transmitter stages TXlcm(e), which sets DQ(e) to Vx, the high logic state of the low common mode signals. Conversely, assertion of PU(e)=0 and PD(e)=1 in the even data paths will turn on the bottom N-channel transistors, which sets DQ(e) to Vssq, the low logic state of the low common mode signals.

Although the transmitter stages TXhcm(o) and TXlcm(e), of the illustrated embodiment, differ from the transmitter stage TX(x) of the prior art (FIG. 2), the buffer stages are essentially no different (except that the number of stages within may be varied). Thus, the buffer stages in the illustrated embodiment of FIG. 4 comprise stages powered by full power supply voltages (either Vdd/Vss or Vddq/Vssq), and so comprise stages that drive signals which fully range between either Vdd/Vss or Vddq/Vssq. Because the buffer stages operate with full swing signals, they are designated in FIGS. 3 and 4 as Bfs(x), where 'fs' designates "full swing," to differentiate from the transmitter stages TXhcm(x) and TXlcm(x) which operate with high and low common mode signals, respectively.

The polarities of the transistors in the transmitter stages TXhcm(o) and TXlcm(e) are chosen to operate sensibly with the full swing signals that drive them. Thus, full drive swing signals ranging from Vddq to Vssq can suitably turn off or on the P-channel transistors in the odd transmitter stages TXhcm(o), as well as the N-channel transistors in the even transmitter stages TXlcm(e).

With the improved output driver circuitry 20' so understood, FIGS. 5A-8 illustrate various data output conditions to show how this circuitry mitigates problems of switching noise and power supply disturbance discussed in the Background section of this disclosure. As noted in the Background, a particularly problematic data output condition comprises the condition in which all (or most) outputs are driven to the same logic states. As stated earlier, the output of all '1's ('11111111') can create noise on Vddq by sourcing excessive current from that supply, while all '0's ('00000000') can create noise on Vssq by sinking excessive current to that supply.

Figure 5B:
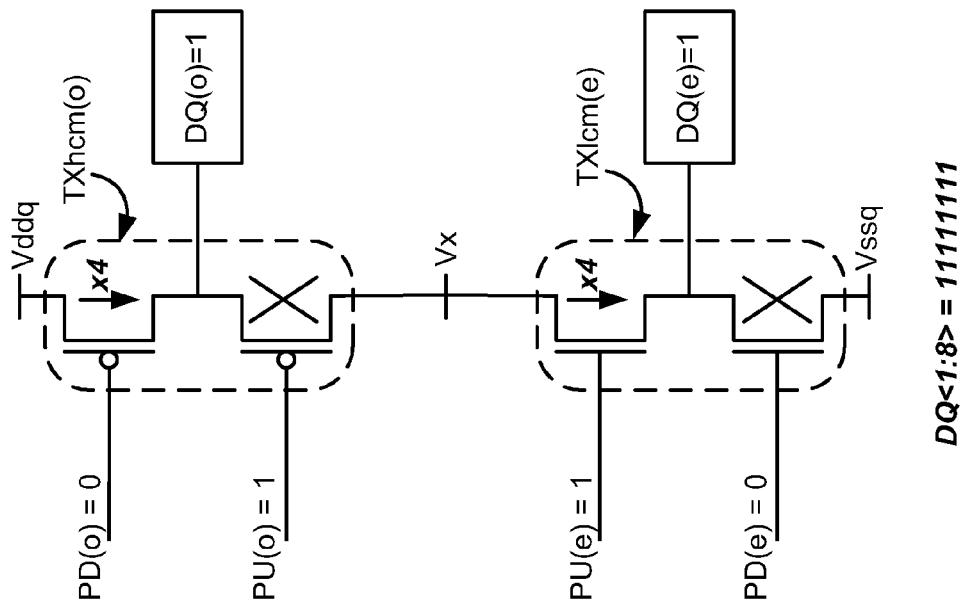
FIGS. 5A-8 illustrate various output conditions, and show that no more than half of the outputs will draw current from, or inject current into, any of the three power supplies at one time, which reduces switching noise.
Figure 5A:
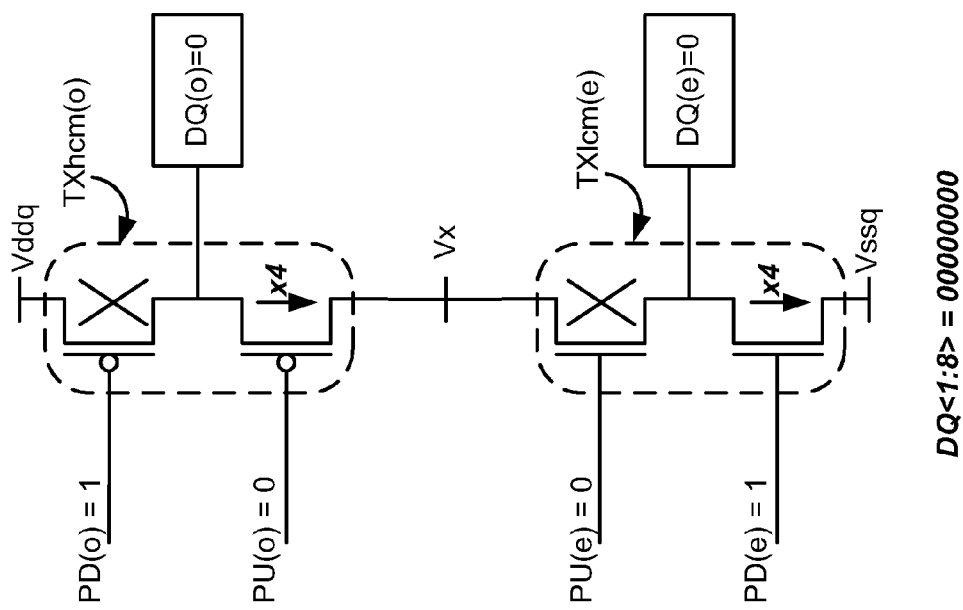

This problem is mitigated in the disclosed solution, as shown in FIGS. 5A and 5B. FIG. 5A shows the condition in which every output drives a logic '0', i.e., DQ<1:8>=00000000. This condition (PD<1:8>=1; PU<1:8>)=0) causes the bottom transistors in the four odd transmitters TXhcm(o) (i.e., TXhcm(1,3,5,7)) to turn on, thus sinking four units of current (x4) to the intermediate supply Vx. This condition likewise causes the bottom transistors in the four even transmitters TXlcm(e) (i.e., TXlcm(2,4,6,8)) to turn on, thus sinking current to Vssq. The top transistors in both the odd and even transmitters, meanwhile, are off (as designated by the X).

FIG. 5B shows the opposite condition in which every output drives a logic '1', i.e., DQ<1:8>=11111111. This condition (PD<1:8>=0; PU<1:8>)=1) causes the top transistors in the odd transmitters TXhcm(o) (i.e., TXhcm(1,3,5,7)) to turn on thus sourcing current from Vddq, and causes the top transistors in the even transmitters TXlcm(e) (i.e., TXlcm(2,4,6, 8)) to turn on thus sourcing current from Vx. The bottom transistors in both the odd and even transmitters, meanwhile, are off (X).

The result with either of the conditions of FIGS. 5A and 5B is that no more than half of the transmitter stages (i.e., 4 for a x8 data bus 11) will source current from Vddq (FIG. 5B) or sink current to Vssq (FIG. 5A). As a result, current draw on supplies Vddq and Vssq is reduced by half, which reduces switching noise on those supply voltages. Vx, which also sources or sinks current in either of these conditions, will experience some perturbation. But such perturbation will effect only the high (TXhcm(o)) or low (TXlcm(e)) common mode transmitter stages, but not both. This is because the low common mode transmitter stages TXlcm(e) are isolated from Vx during the all '0's condition due to their opened top transistors (FIG. 5A), while the high common mode transmitter stages TXhcm(o) are isolated from Vx during the all '1's condition due to their opened bottom transistors (FIG. 5B). In any event, Vx never sources or sinks current to or from more than half of transmitter stages, which minimizes Vx perturbation in any case. In other conditions discussed below, it will be seen that often nearly an equal amount of current flows into and out of Vx, thus minimizing perturbation on that supply.

Figure 6B:
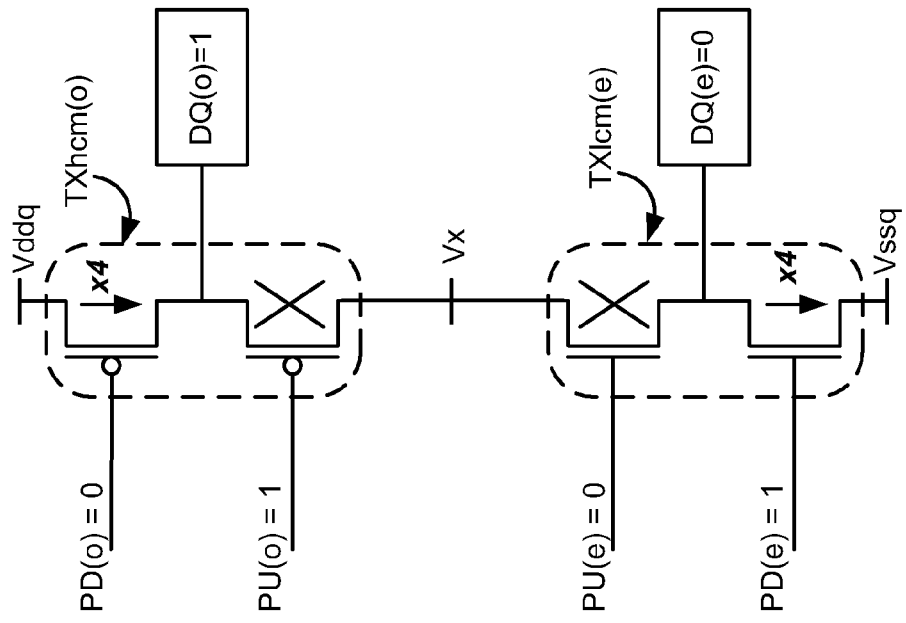
Figure 6A:
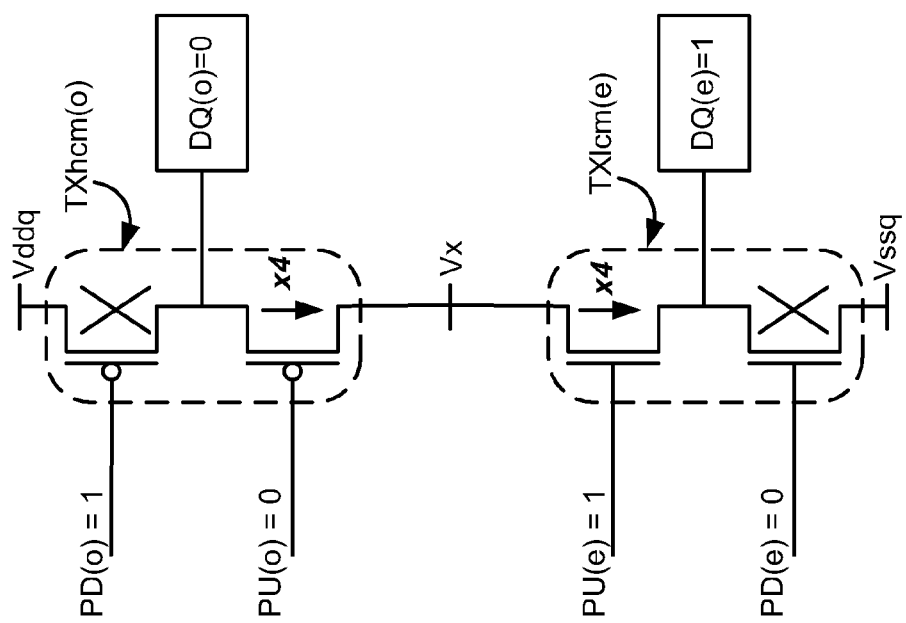

FIGS. 6A and 6B illustrate other unique conditions in which the outputted logic states alternate, with FIG. 6A illustrating the condition DQ<1:8>=01010101, and FIG. 6B illustrating the complementary condition DQ<1:8>=10101010. In the first case (FIG. 6A), the top transistors in the odd transmitters TXhcm(o) are off, and the bottom transistors in the even transmitters TXlcm(e) are off. This isolates Vddq and Vssq, ensuring no perturbation on those supplies. Vx meanwhile sinks current from the odd transmitter circuits to form DQ(o)=0, and sources current to the even transmitter circuits to form DQ(e)=1. Because the same number of outputs source and sink current from/to Vx, the effect is to essentially cancel any perturbation on the Vx supply, and thus this condition tends to minimize noise on that supply as well.

In the second case (FIG. 6B), the bottom transistors in the odd transmitters TXhcm(o) are off, and the top transistors in the even transmitters TXlcm(e) are off, thus isolating Vx. Vddq sources current to the odd outputs to form DQ(o)=1, while Vssq sinks current from the even outputs to form DQ(e)=0. Thus, for this condition, Vddq and Vssq respectively source and sink current from only half of the outputs, which as noted earlier minimizes the possibility of switching noise on those supplies and thus marks an improvement from the prior art.

Figure 7:
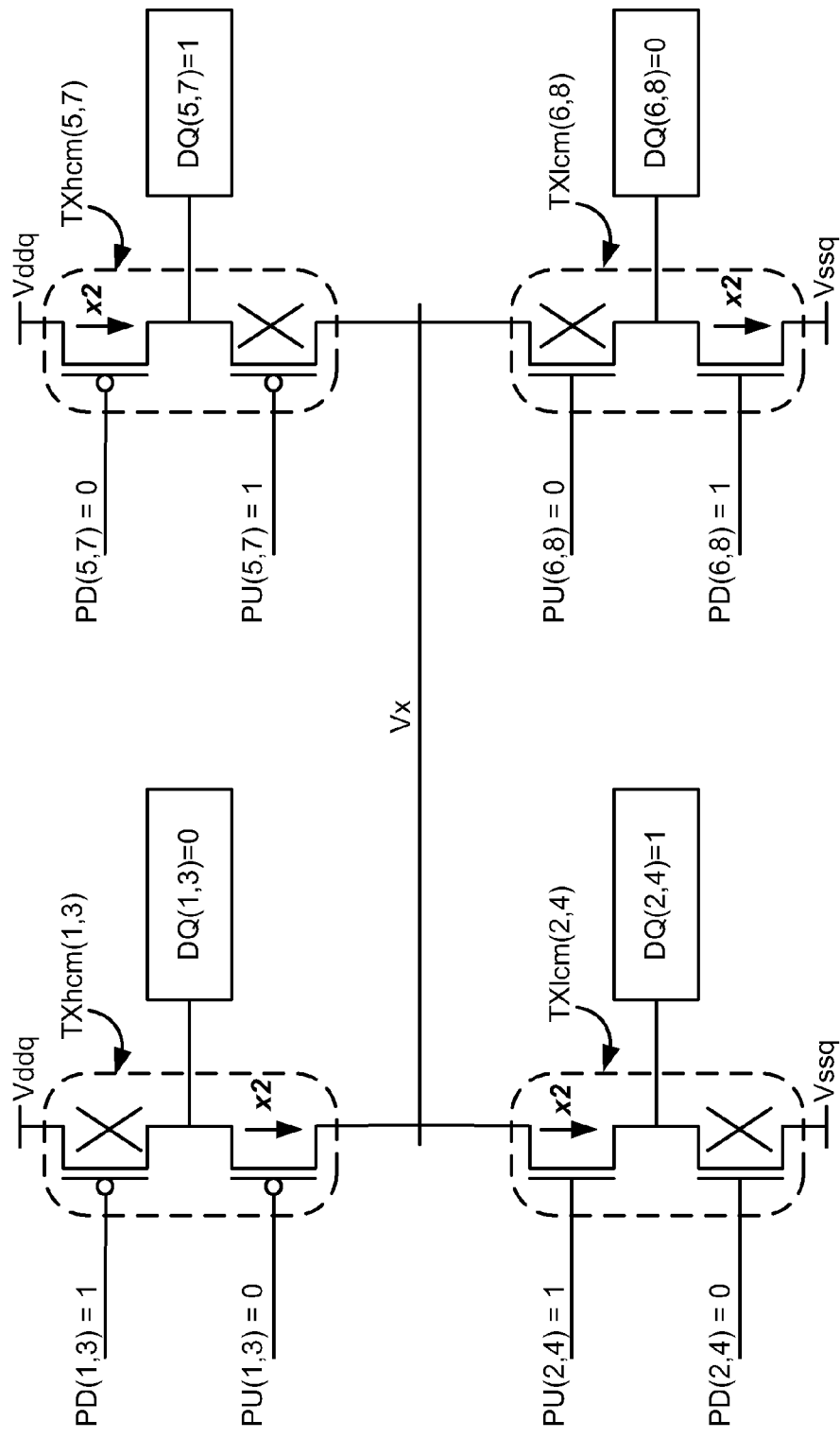
Figure 8:
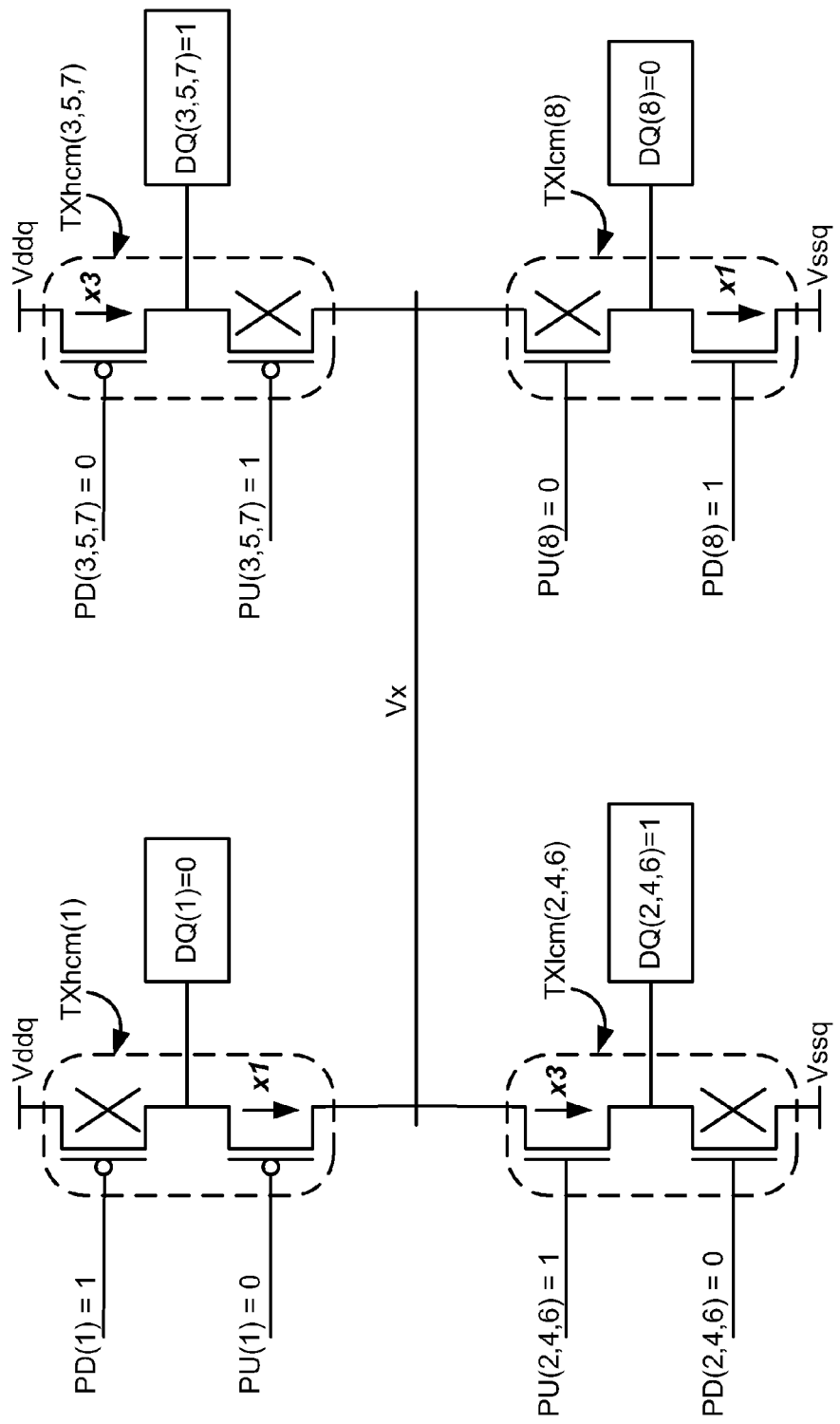

FIGS. 7 and 8 illustrate other conditions of interest. In FIG. 7, condition DQ<1:8>=01011010 is shown. In this condition, only two (i.e., one quarter) of the outputs (DQ(1,3)) sink current to Vx, while another two (DQ(2,4)) source current from Vx, which balances as just noted, thus tending to minimize noise on that supply. Meanwhile, only two of the outputs (DQ(5,7)) source current from Vddq while only two (DQ(6,8)) sink current to Vssq, which is not a particularly heavy load for either of these supplies, and therefore of reduced noise concern. (It should be noted that condition DQ<1:8>=01011010 is not the only condition that will cause the same current loading as illustrated in FIG. 7. For example, DQ<1:8>=10100101 or 01111000 would present a similar loading).

FIG. 8 shows the more unbalanced condition of DQ<1:8>=01111110. In this condition, Vddq sources current to three outputs (DQ(3,5,7)) while Vssq sinks current from one output (DQ(8)). Vx sinks current from one output (DQ(1)) and sources current to three outputs (DQ(2,4,6)), amount to a net sourcing to two outputs from Vx. Although the current draws are unbalanced from supplies Vddq, Vssq, and Vx, none of these supplies sees a particularly large draw of current.

The various conditions of FIGS. 5A-8 thus show that the improved output driver circuitry 20' minimizes the current draws from the various power supplies (Vddq, Vssq, and Vx). In no case is it possible for any one supply to source or sink current from/to more than half of the outputs DQ(x), thus minimizing switching noise.

Because the improved output driver circuitry 20' employs different signaling for the odd (high common mode) and even (low common mode) outputs, the receiving circuitry at the receiving device 12 should accommodate such differences. Accordingly, and as shown in FIG. 4, the receiving device 12 employs high common mode receivers (RXhcm(o)) to sense the odd outputs DQ(o) and low common mode receivers (RXlcm(e)) to sense the even outputs (DQ(e)).

Figure 9A:
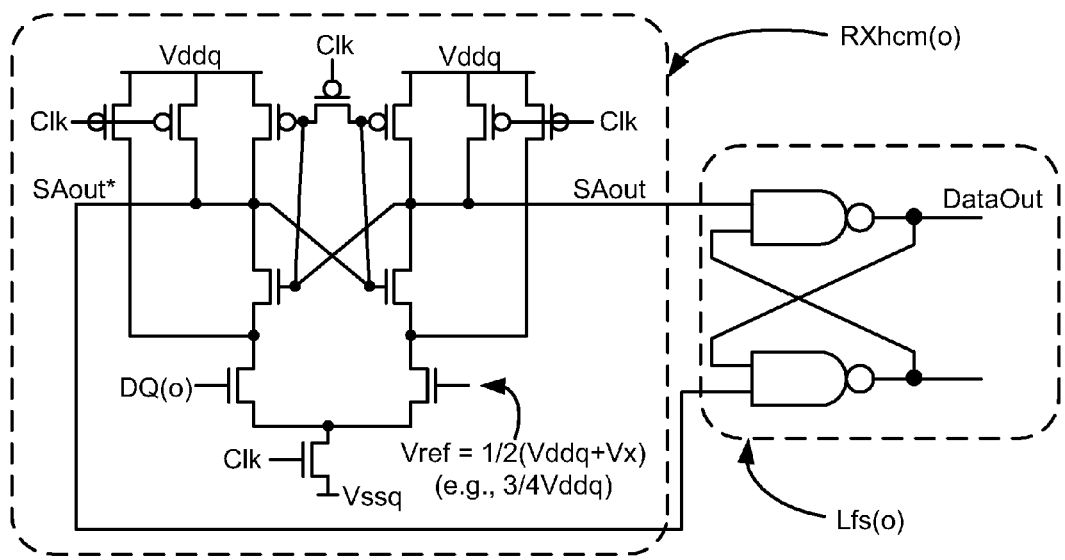
FIGS. 9A-10B illustrate high and low common mode receivers usable in a receiving device operating in accordance with an embodiment of the invention.
Figure 9B:
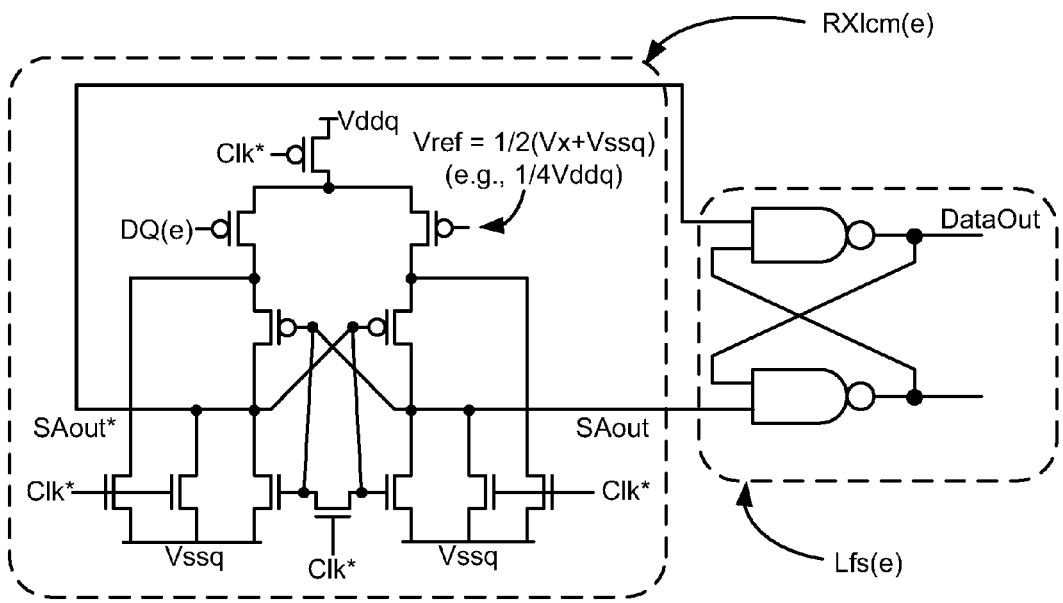

Example receiver circuitry for RXhcm(o) and RXlcm(e) are shown in FIGS. 9A and 9B, respectively. Each of these receiver designs essentially comprises a sense amplifier for sensing the data state of the outputs DQ(x) upon the assertion of a clock signal (Clk), often referred to as a "strobe". The sense amplifiers provide a full swing (i.e., Vddq to Vssq) differential output (SAout/SAout*) to a latch comprising cross coupled NAND gates The latch is labeled as "Lfs" to make clear the transition between high and low common mode and full swing signal processing. Although it is usually convenient to stabilize and hold the output SAout/SAout* from the receivers RXhcm(o) and RXlcm(e) using latch circuitry, latch circuitry Lfs(x) is not strictly required.

As is common in sense amplifier circuits, the input signal—i.e., the output DQ(x) being sensed—is compared to a reference voltage, Vref. Preferably (but not necessarily), this reference voltage is set at a midpoint between the range of voltages being sensed. Accordingly, in FIG. 9A, which senses the high common mode signals from the odd outputs, a reference value between Vddq and Vx is chosen, which may equal ¾Vddq for example. When the incoming high common mode signal is higher (e.g., Vddq) than Vref, SAout is asserted; when lower (e.g., Vx), SAout* (its complement) is asserted. In FIG. 9B, which senses the low common mode signals from the even outputs, a reference value between Vx and Vssq is chosen, which may equal ¼Vddq for example. When the incoming low common mode signal is higher (e.g., Vx) than Vref, SAout is asserted; when lower (e.g., Vssq), SAout* is asserted.

Notice that to accommodate the differences in the absolute voltages of the low and high common mode signals the orientation and polarities of the transistors in the receiver circuits RXhcm(o) and RXlcm(e) are reversed. One skilled in the art will understand that such reversal will generally keep the speed and operations of the two receiver circuits in parity.

While this disclosure has focused on reducing noise in the transmitting device, many state-of-the-art interfaces provide On-Die Termination (ODT) within the receiving device to minimize signal reflections on the bus 11, as discussed earlier. ODT may be implemented in several ways, including the use of resistors and/or transistors. Sometimes, ODT is implemented using either the drive signals (e.g., PU and PD) of the receiving device (when receiving such signals are not used to drive), and this same method of providing ODT can be achieved using the disclosed technique. For example, the receiver pull up device can be enabled and its pull down device disabled, which provides an impedance matching termination to Vddq (suitable for high common mode signal reception). Similarly, the receiver pull down device can be enabled and its pull up device enabled, which provides an impedance matching termination to Vssq (suitable for low common mode signal reception). While providing such ODT in the context of the present disclosure has the potential to increase supply noise on the power supplies within the receiver, only a fraction of the bus (even or high common mode signals) will terminate to Vddq, while the remaining (odd or low common mode) signals will terminate to Vssq, which reduces the supply noise within the receiving device.

Figure 10A:
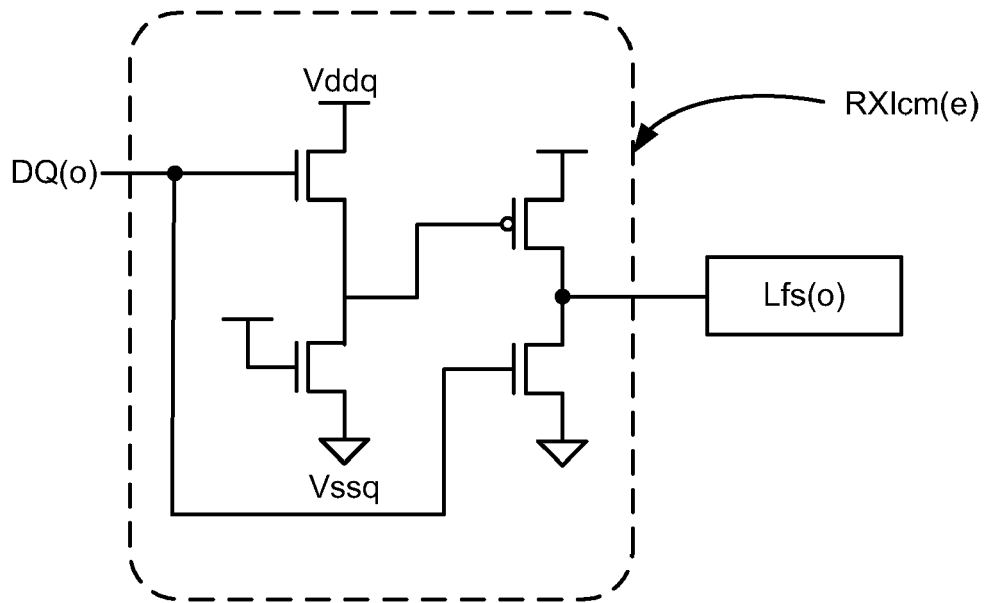
Figure 10B:
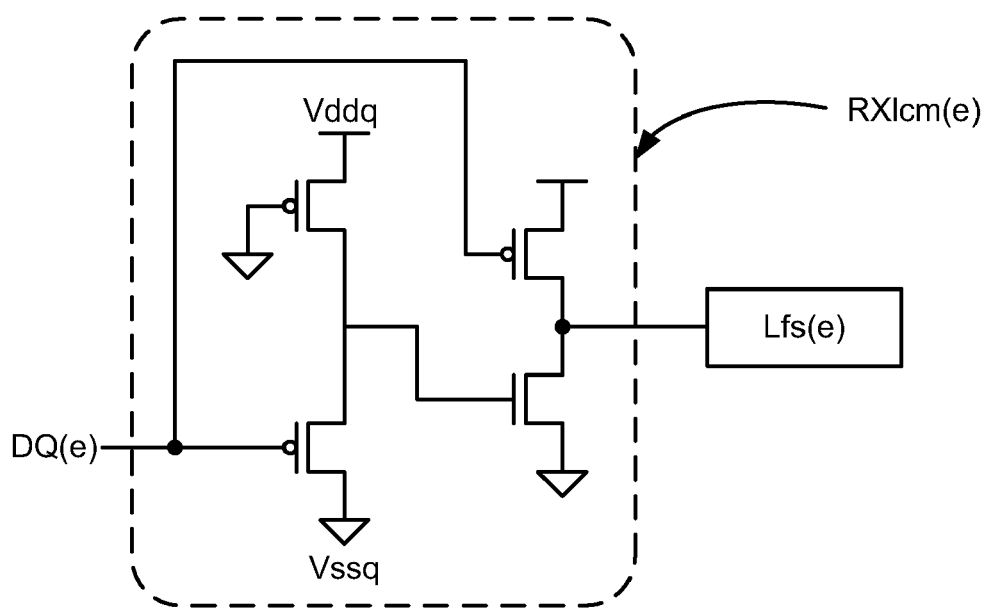

FIGS. 10A and 10B show alternative receiver circuits RXhcm(o) and RXlcm(e) that can be used at the receiving device 12 to sense the high and low common mode signals respectively. However, because further information concerning the design and operation of these and similar receiver circuit designs can be found in U.S. patent application Ser. No. 12/106,552, filed Apr. 21, 2008, to which the reader is referred, the circuits of FIGS. 10A and 10B are not further discussed here.

Figure 11:
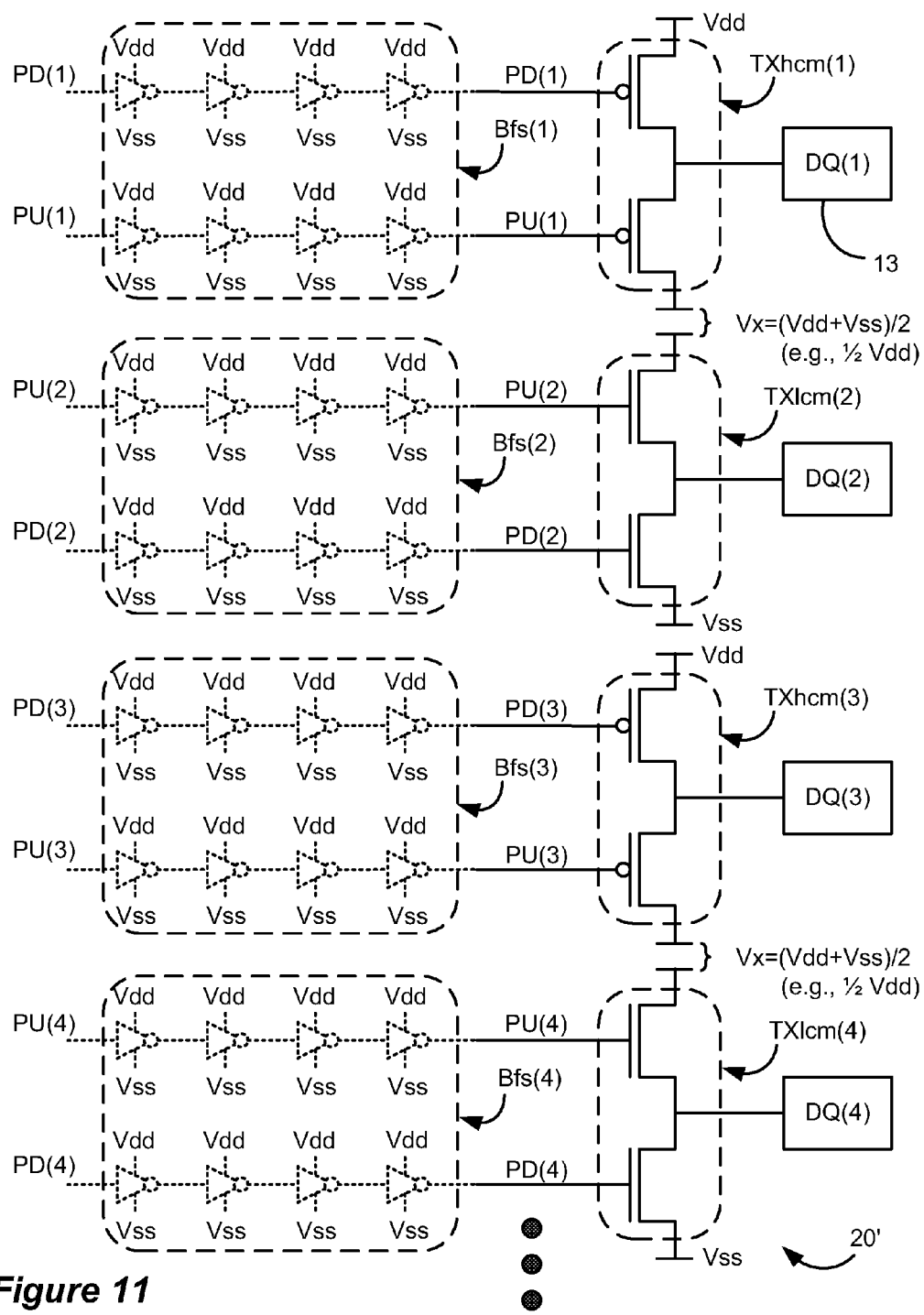
FIG. 11 illustrates that use of the disclosed technique can dispense with the need for power supply isolation at the output driver circuitry.

Modifications to the disclosed circuitry and techniques are possible. For example, it was mentioned in the Background section that output driver circuitry typically comprises a power supply domain boundary 15 separating the Vdd/Vss and Vddq/Vssq power domains. A primary reason for doing so is to prevent corruption on the interior Vdd/Vss power supplies resulting from switching noise at the outputs, and in particular noise resulting from the simultaneous output of a predominate logic state (e.g., all or mostly '1's or '0's) or transitioning between such states. Thus, the transmitter stages TX(x) (FIG. 2) in the output path, and perhaps some of the preceding buffer stages B(x), are powered by Vddq and Vssq, while the remaining, lower-current circuits (e.g., smaller buffer stages, etc.) are connected between Vdd and Vss. In contrast, the disclosed technique, employing three power supply voltages (Vddq, Vssq, and Vx) and a combination of high and low common mode signaling, reduces the severity of such switching noise. As a result, when the disclosed technique is implemented, it may not be necessary to employ two isolated power supply domains with their associated power supply domain boundary 15. For example, in FIG. 11, implementation of the disclosed technique uses only a single power supply domain, Vdd/Vss. Whether such a single power supply domain implementation will be suitably reliable for a given application may require simulation, as one skilled in the art will appreciate.

Figure 12:
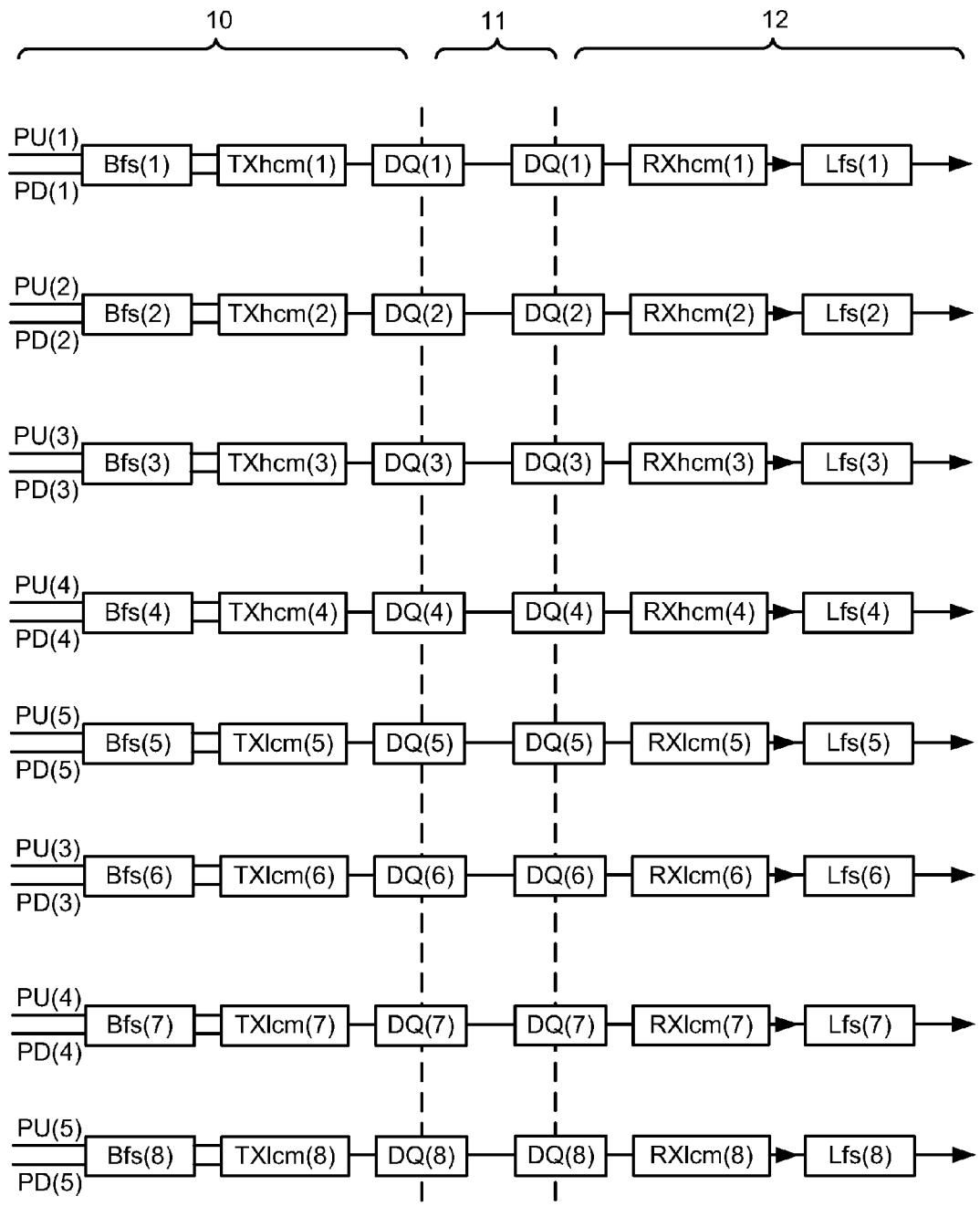
FIG. 12 illustrates alternative manners in which the output data paths can be grouped to operate with either low or high common mode signaling.

To this point, this disclosure has discussed the benefits of providing high and low common mode signaling on odd and even outputs respectively. This is believed sensible as it would tend to balance the improved circuitry over the area encompassed by the output data paths on the integrated circuit in which it is incorporated. However, altering the signaling scheme between odd and even output data paths is not strictly required. Instead, in another design, one can designate different combinations of output paths to operate with high or low common mode signals. For example, as shown in FIG. 12, high common mode signaling and circuitry is provided for the first four outputs, DQ(1)-DQ(4), while low common mode signaling and circuitry is provided for the last four outputs, DQ(5)-DQ(8). Organizing the high and low common mode circuitry in this manner between the output data paths still achieves the benefit of reduced switching noise. Of course, still other organizations are possible (e.g. DQ(1,2) and DQ(5,6) operating at low common mode; DQ(3,4) and DQ(7,8) operating at high common mode, etc.).

While it is logical that equal numbers of outputs operate at high and low common modes, this is not strictly necessary. For example, five outputs could operate at high common mode, with three operating at low common mode. This would reduce switching noise concerns as compared to the prior art, but less so than were a balanced numbered of outputs considered as disclosed herein. Having said this, such an unbalanced approach could prove useful to counter other imbalances in the system. For example, the design of the package, into which the integrated circuit may be placed, may not balance the Vddq and Vssq power delivery (e.g., the common use of ground planes in the package can result in a more stable ground or Vssq). In such cases, it may be advantageous to assign more than half of the data bus to low common mode signaling, and consequently run less than half of the signals with high common mode signaling.

In another variation, the absolute level of the intermediate power supply, Vx, may be offset from the exact midpoint between Vddq and Vssq to counter additional imbalances. For example, it is well known in the art that P-channel transistors lack the drive of their N-channel counterparts. As a result, it may be advantageous to set Vx to ⅓Vddq, rather than ½ Vddq, to provide the P-channel transistors in the high common mode transmitters a wider output swing than the N-channel-based low common mode transmitters.

It should also be noted that use of dual drive signals (PU and PD) in each output path is not strictly required. For example, there may be only one drive signal per output path, whose data state dictates whether a given transmitter will drive a high or low logic signal.

The proposed signaling scheme could also be applied to a differential interface, wherein the high and low common mode signals are transmitted with, and received with respect to, their complements, thus eliminating the need for high and low reference voltages.

While conceived of in the context of an improved SDRAM 10, it should be noted that use of the disclosed circuitry and techniques are not limited to such an integrated circuit. Instead, the disclosed circuitry and techniques can be implemented in any integrated circuit or integrated circuit block requiring output/input to/from a parallel bus. Such a parallel bus can comprise a data bus, but may carry other types of signals as well (addresses, control signals, etc.).

Figure 13:
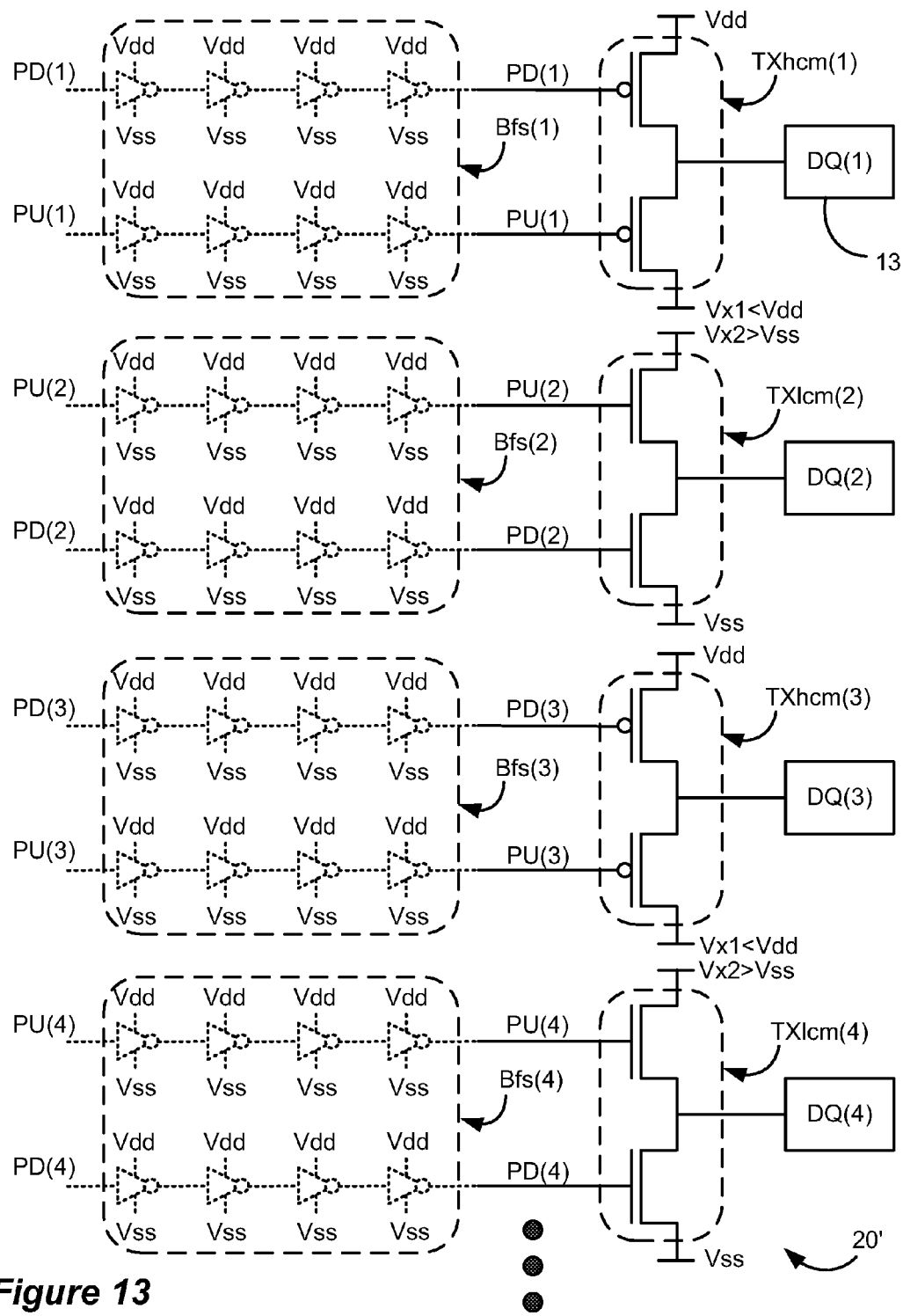
FIG. 13 illustrates an alternative in which the high and low common mode receivers do not share the intermediate power supply Vx, but instead each receive unique intermediate power supply voltages Vx1 and Vx2.

FIG. 13 illustrates still another variation of the disclosed technique. In this example of the improved output driver circuitry 20', the odd high common mode transmitter stages TXhcm(o) and the even low common mode transmitter stages TXlcm(e) each are powered by different intermediate power supply voltages: Vx1 for the low side of the high common mode transmitter, and Vx2 for the high side of the low common mode transmitters. As shown, Vx1 is smaller than Vdd (or Vddq; however FIG. 13, like FIG. 11, assumes an implementation in which no power supply domain boundary is used), and Vx2 is larger than Vss (or Vssq). However, Vx1 and Vx2 need not be the same voltage: for example, Vx1 could be ⅓Vdd while Vx2 is ⅔Vdd, or Vx1 could be ⅔Vdd while Vx2 is ⅓Vdd. In any case, the odd and even transmitters would still output high and low common mode signals respectively, i.e., those that range from Vdd to Vx1 on the odd outputs DQ(o) and that range from Vx2 to Vss on the even outputs DQ(e).

This embodiment would require the generation of two additional power supply voltages (Vx1 and Vx2) as opposed to earlier embodiments requiring the generation of only a single intermediate power supply (Vx). However, distribution of the intermediate power supply between the two voltages Vx1 and Vx2 may even further reduce noise that would otherwise be present on the single Vx supply discussed in earlier embodiments, though as was shown, much of the noise on the single supply Vx is canceled in any event. Further, the use of two intermediate power supplies Vx1 and Vx2 can allow the operation of each of the transmitters to be independently tailored. For example, the reduced swing produced by the P-channel-based high common mode transmitter could be made larger than the reduced swing produced by the N-channel based low common mode transmitter (i.e., Vdd-Vx1>Vx2-Vss), to balance the drive between the P- and N-channel transistors in those transmitters, as discussed above.

Alternatively, a fourth supply (Vx2) allows the disclosed technique to be extended to further divide the bus into three groups of signals, with high common mode signaling taking place between supplies Vddq and Vx1, low common mode signaling between Vx2 and Vssq, and mid common mode signaling between Vx1 and Vx2. Implementation of the mid common mode transmitter and receiver circuitry would not be complex in such an implementation. As concerns the mid common mode transmitters, normal complementary transmitters (e.g., comprising a P-channel pull up transistor in series with an N-channel pull down transistor) could be used. As concerns the mid common mode receivers, a receiver such as that disclosed in FIG. 9B could be used, with the reference voltage, Vref, set to the mid point between Vx1 and Vx2 (e.g., ½Vddq). Use of such a three-signal group scheme would further limit the loading and switching noise on all supplies to a third of the value experienced using the prior art circuitry of FIG. 2 for example.

While certain embodiments of the invention have been disclosed, it should be understood that other embodiments can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. An integrated circuit, comprising:
   at least one circuit block powered by a power supply domain and operable at full swing signals with respect to the power supply domain; and
   a plurality of outputs from the integrated circuit, wherein at least one of the outputs comprises a high common mode signal with respect to the power supply domain and wherein at least one other output comprises a low common mode signal with respect to the power supply domain, wherein the at least one high common mode signal is produced by a transmitter stage comprising two serially-connected P-channel transistors, and wherein the at least one low common mode signal is produced by a transmitter stage comprising two serially-connected N-channel transistors, wherein the at least one high common mode signal is produced at a node between the two serially-connected P-channel transistors, and wherein the at least one low common mode signal is produced at a node between the two serially-connected N-channel transistors.

2. The integrated circuit of claim 1, wherein the integrated circuit comprises an SDRAM.

3. The integrated circuit of claim 2, wherein the at least one circuit block comprises logic circuitry.

4. The integrated circuit of claim 3, wherein the at least one circuit block further comprises at least a portion of output drive circuitry that produces the plurality of outputs in accordance with drive signals.

5. The integrated circuit of claim 1, wherein the high and low common mode signals share a common voltage.

6. The integrated circuit of claim 1, wherein the high and low common mode signals do not share a common voltage.

7. The integrated circuit of claim 1, wherein the plurality of outputs from the integrated circuit output data in parallel.

8. An integrated circuit, comprising:
a plurality of buffer stages, each buffer stage for receiving at least one first drive signal and for producing at least one second drive signal, wherein the plurality of buffer stages are powered by at least a first power supply domain comprising a first voltage and a second voltage; and a first plurality of transmitters stages powered by a second power supply domain comprising the first voltage and a third voltage, each first transmitter stage for receiving the at least one second drive signal from one of the plurality of buffer stages, each first transmitter stage for producing a first output from the integrated circuit, a second plurality of transmitters stages powered by a third power supply domain comprising the second voltage and the third voltage, each second transmitter stage for receiving the at least one second drive signal from one of the plurality of buffer stages, each second transmitter stage for producing a second output from the integrated circuit.

9. The integrated circuit of claim 8, wherein each buffer stage comprises a plurality of stages.

10. The integrated circuit of claim 9, wherein the pluralities of stages comprise inverters.

11. The integrated circuit of claim 8, wherein each buffer stage receives two first drive signals.

12. The integrated circuit of claim 11, wherein the two first drive signals received by each buffer stage are complementary.

13. The integrated circuit of claim 8, wherein each transmitter stage produces an output from the integrated circuit in parallel with the other outputs.

14. The integrated circuit of claim 8, wherein the first outputs comprise high common mode signals with respect to the first power supply domain, and wherein the second outputs comprise low common mode signals with respect to the first power supply domain.

15. A method for transmitting signals from first integrated circuit to a second integrated circuit, comprising:

producing a plurality of drive signals in a first integrated circuit, wherein the drive signals comprise full swing signals with respect to a power supply domain in the first integrated circuit; and driving a plurality of transmitters in the first integrated circuit with at least one of the drive signals to produce an integrated circuit output from each transmitter, wherein a first plurality of the outputs comprise a high common mode signal with respect to the power supply domain, and wherein a second plurality of the outputs comprise a low common mode signal with respect to the power supply domain, wherein each transmitter comprises two serially-connected transistors, and wherein the integrated circuit outputs are produced at a node between the two serially-connected transistors in each transmitter;

receiving the first and second plurality of outputs at receiver circuitry at a second integrated circuit; and converting at the receiver circuitry the received outputs into full swing signals with respect to a power supply domain operating in the second integrated circuit.

16. The method of claim 15, wherein the high common mode signals range between a first voltage and a second voltage lower than the first voltage, and wherein the low common mode signals range between a third voltage and a fourth voltage greater than the third voltage.

17. The method of claim 16, wherein the second voltage is lower than the fourth voltage.

18. The method of claim 16, wherein the second voltage is higher than the fourth voltage.

19. The method of claim 16, wherein the difference between the first and second voltages is different from the difference between the third and fourth voltages.

20. The method of claim 15, wherein the plurality of transmitters are driven in parallel to produce the integrated circuit outputs.

21. An integrated circuit, comprising:
at least one circuit block powered by a power supply domain and operable at full swing signals with respect to the power supply domain comprising a power supply voltage and a ground voltage lower than the power supply voltage; and a plurality of outputs from the integrated circuit, wherein at least one of the outputs comprises a high common mode signal ranging between the power supply voltage and a first voltage lower than the power supply voltage but higher than the ground voltage, and wherein at least one other output comprises a low common mode signal ranging between the ground voltage and a second voltage lower than the power supply voltage but higher than the ground voltage, wherein the at least one high common mode signal is produced by a transmitter stage comprising two serially-connected P-channel transistors, and wherein the at least one low common mode signal is produced by a transmitter stage comprising two serially-connected N-channel transistors.

22. The integrated circuit of claim 21, wherein the integrated circuit comprises an SDRAM.

23. The integrated circuit of claim 22, wherein the at least one circuit block comprises logic circuitry.

24. The integrated circuit of claim 23, wherein the at least one circuit block further comprises at least a portion of output drive circuitry that produces the plurality of outputs in accordance with drive signals.

25. The integrated circuit of claim 21, wherein the at least one high common mode signal is produced at a node between the two serially-connected P-channel transistors, and wherein the at least one low common mode signal is produced at a node between the two serially-connected N-channel transistors.

26. The integrated circuit of claim 21, wherein the first and second voltages are the same.

27. The integrated circuit of claim 26, wherein the first and second voltages comprises another power supply voltage.

28. The integrated circuit of claim 21, wherein the first and second voltage are different.

* * * * *